(12) United States Patent
Miller

(10) Patent No.: US 9,599,895 B2
(45) Date of Patent: Mar. 21, 2017

(54) LITHOGRAPHY USING PHOTORESIST WITH PHOTOINITIATOR AND PHOTOINHIBITOR

(71) Applicant: EMPIRE TECHNOLOGY DEVELOPMENT LLC, Wilmington, DE (US)

(72) Inventor: Seth Adrian Miller, Englewood, CO (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 272 days.

(21) Appl. No.: 14/048,682

(22) Filed: Oct. 8, 2013

(65) Prior Publication Data

US 2014/0038103 A1    Feb. 6, 2014

Related U.S. Application Data

(62) Division of application No. 13/123,816, filed on Apr. 12, 2011, now Pat. No. 8,580,479.

(51) Int. Cl.
*G03F 7/004* (2006.01)
*G03F 7/20* (2006.01)

(52) U.S. Cl.
CPC .......... *G03F 7/0045* (2013.01); *G03F 7/2045* (2013.01); *G03F 7/2053* (2013.01)

(58) Field of Classification Search
None
See application file for complete search history.

(56) References Cited

U.S. PATENT DOCUMENTS

| 4,269,933 A | 5/1981 | Pazos |
| 4,491,628 A | 1/1985 | Ito et al. |
| 4,595,651 A | 6/1986 | Grossa |
| 4,923,780 A | 5/1990 | Taylor, Jr. |
| 5,650,261 A * | 7/1997 | Winkle ...................... 430/270.1 |

(Continued)

FOREIGN PATENT DOCUMENTS

WO    2008/069813    6/2008

OTHER PUBLICATIONS

Li et al., "Two-Photon Microstructure-polymerization Initiated by a Coumarin derivative/iodonium salt System", Jun. 8, 2001, Chemical Physics Letters, 340, 444-448.*

(Continued)

*Primary Examiner* — Martin Angebranndt
*Assistant Examiner* — Anna Malloy
(74) *Attorney, Agent, or Firm* — Moritt Hock & Hamroff LLP; Steven S. Rubin, Esq.

(57) ABSTRACT

Technologies are generally described for a photoresist and methods and systems effective to form a pattern in a photoresist on a substrate. In some examples, the photoresist includes a resin, a photoinitiator and a photoinhibitor. The photoinitiator may be effective to generate a first reactant upon the absorption of at least one photon of a particular wavelength of light. The first reactant may be effective to render the resin soluble or insoluble in a photoresist developer. The photoinhibitor may be effective to generate a second reactant upon the absorption of at least one photon of the particular wavelength of light. The second reactant may be effective to inhibit the first reactant.

7 Claims, 4 Drawing Sheets

(56) References Cited

U.S. PATENT DOCUMENTS

| | | | |
|---|---|---|---|
| 6,114,082 A | 9/2000 | Hakey et al. | |
| 6,395,451 B1* | 5/2002 | Jung et al. | 430/270.1 |
| 6,608,228 B1 | 8/2003 | Cumpston et al. | |
| 6,852,766 B1* | 2/2005 | DeVoe | C08F 2/50 430/270.1 |
| 2002/0160318 A1* | 10/2002 | Richter | G03F 7/0045 430/324 |
| 2004/0096773 A1 | 5/2004 | Jung et al. | |
| 2005/0181313 A1* | 8/2005 | Shih | G03F 7/203 430/394 |
| 2009/0130611 A1 | 5/2009 | Zandbergen et al. | |
| 2009/0176174 A1 | 7/2009 | Chen et al. | |
| 2010/0119976 A1* | 5/2010 | Park | G03F 7/031 430/286.1 |
| 2010/0216070 A1 | 8/2010 | Yamanaka et al. | |

OTHER PUBLICATIONS

Endo et al., "Improved Positive Surface Modification Resist Process for 192nm Lithography", Jun. 29, 1998, SPIE, 3333, 534-545.*

Tasdelen et al. "Photochemically masked benzophenone: Photoinitiated free radical polymerization by using benzodioxinone" Sep. 25, 2006, Polymer 47 7611-7614.*

Tasdelen et al. "Photochemically masked benzophenone: Photoinitiated free radical polymerization by using benzodioxinone"; Polymer (2006) 7611-7614.

Jang et al. "Positive-Type Photosensitive Polyimide Based on a Photobase Generator Containing Oxime-Urethane Groups as a Photosensitive Compound"; Macromolecular Research (2006), 14(3): 300-305.

Li et al. "Achieving λ/20 Resolution by One-Color Initiation and Deactivation of Polymerization"; Science (2009), 324: 910-913.

O'Connor et al. "Toward the Design of a Sequential Two Photon Photoacid Generator for Double Exposure Photolithography"; Chem. Mater. (2008), 20(24): 7374-7376.

Wright "Fundamentals of Microfabrication: Lithography"; Laser Microfabrication Chem (2009), 750.

Kumbaraci et al. "Photoinduced Synthesis of Oligoesters"; Macromolecules (2006), 39(18): 6031-6035.

Xing et al. "Improving Spatial Resolution of Two-Photon Microfabrication by using Photoinitiator with High Initiating Efficiency"; Appl. Phys. Lett (2007), 90: 131106.

Shirai et al. "Photoacid and Photobased Generators: Prospects and their use in the development of polymeric photosensitive systems"; Bulletin of the Chemical Society of Japan (1998), 71: 2483-2507.

Scott et al. "Two-color single-proton photoinitiation and photoinhibition for Subdiffraction Photolithography"; Science (2009) 324: 913-917.

PCT International Search Report PCT/ISA/210 for PCT/US10/055269 dated Feb. 7, 2011.

PCT Written Opinion of the International Searching Authority PCT/ISA/237 for PCT/US10/055269 dated Feb. 7, 2011.

Woodward et al. "Characterization of the latent image to developed image in model EUV photoresists"; Proc. of SPIE (2008) 6923: 692328-1-692328-12.

Tasdelen et al. "Photoacid Generation by Stepwise Two-Photon Absorption: Photoinitiated Cationic Polymerization of Cyclohexene Oxide by Using Benzodioxinone in the Presence of Iodonium Salt"; Macromolecules (2008), 41(2): 295-297.

"Lithography: immersion, hyper-numerical aperture (hyper-NA) and double exposure all come to the party," accessed at https://web.archive.org/web/20070710192107/http://edn.com/blog/1690000169/post/860005086.html, posted on Oct. 25, 2006, pp. 4.

* cited by examiner

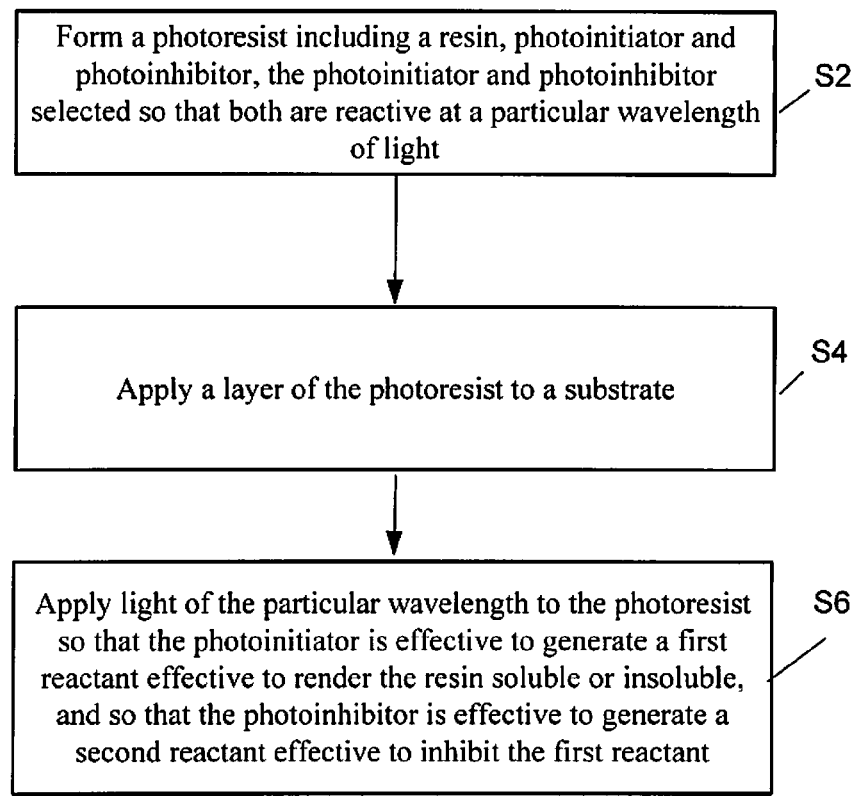
Fig. 2              200

300 A computer program product.

302 A signal bearing medium.

304
    At least one of

One or more instructions for a method for forming a pattern in a photoresist on a substrate;
    or
    One or more instructions for applying a layer of photoresist to a substrate, wherein said photoresist comprises
        a resin,
        a photoinitiator effective to generate a first reactant upon the absorption of at least one photon of a particular wavelength of light, wherein the first reactant is effective to render the resin soluble or insoluble in a photoresist developer, or
        a photoinhibitor effective to generate a second reactant upon the absorption of at least one photon of the particular wavelength of light, wherein the second reactant is effective to inhibit the first reactant; or
    One or more instructions for applying to the photoresist light of the particular wavelength through a mask having a pattern to form the pattern in the photoresist.

| 306 A computer readable medium | 308 A recordable medium | 310 A communications medium |

Fig. 3

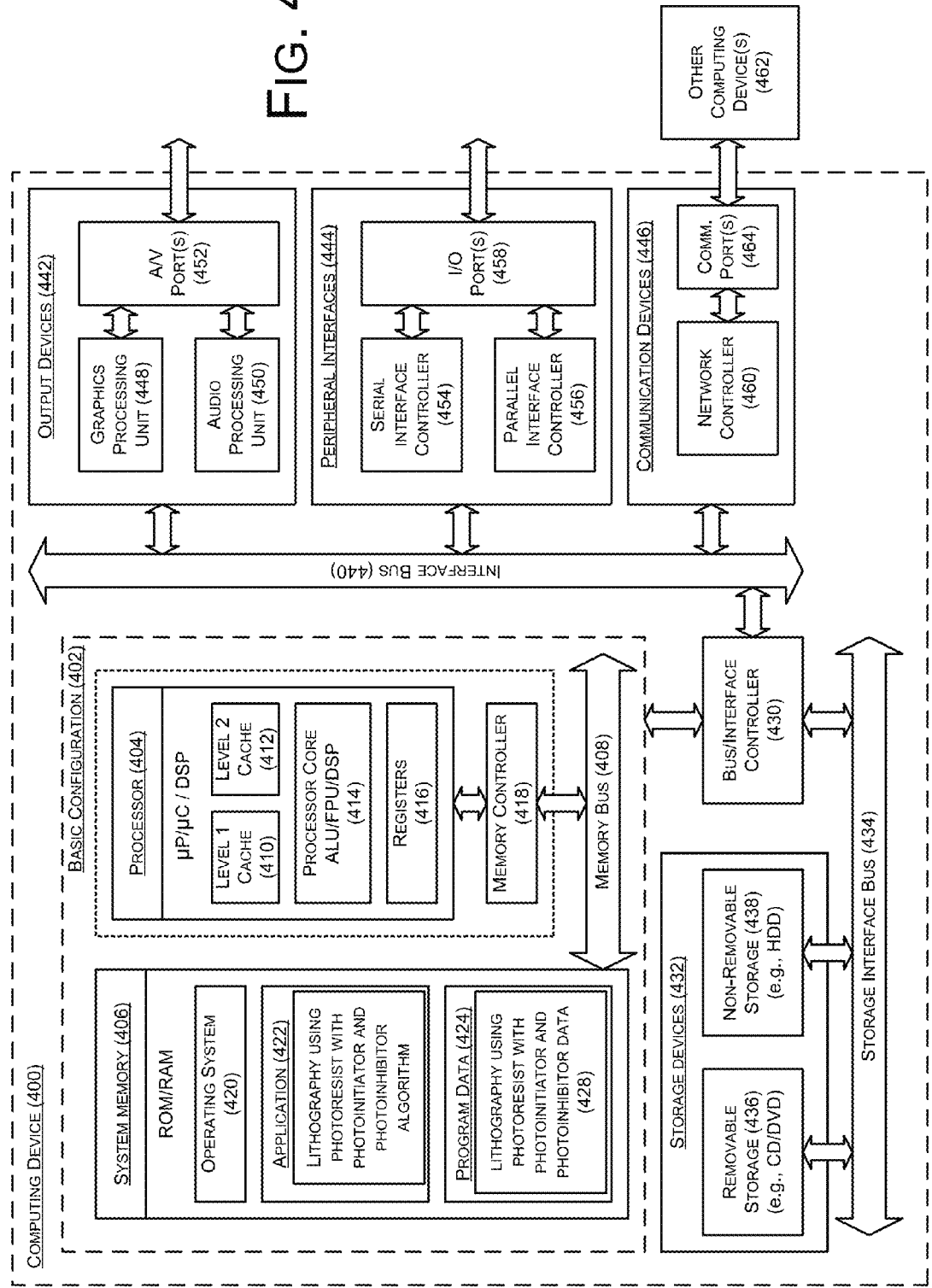

LITHOGRAPHY USING PHOTORESIST WITH PHOTOINITIATOR AND PHOTOINHIBITOR

CROSS REFERENCE TO RELATED APPLICATION

This application is a divisional under 35 U.S.C. §121 of application 13/123,816 filed Apr. 12, 2011, the entirety of which is hereby incorporated by reference.

BACKGROUND

Unless otherwise indicated herein, the materials described in this section are not prior art to the claims in this application and are not admitted to be prior art by inclusion in this section.

In optical lithography, a pattern may be formed on a substrate using a mask. In some examples, a light sensitive photoresist layer may be applied to the substrate. A light source may apply a beam of light to the substrate through the mask. The pattern on the mask may cause the light beam to expose some areas of the photoresist and block other areas of the photoresist from exposure based on the pattern. The photoresist may react to the applied light to form the pattern on the substrate. An optical system may be interposed between the mask and the substrate allowing for changes in a size of the pattern exposed to the photoresist layer.

SUMMARY

In an example, a photoresist is generally described. The photoresist may include a resin, a photoinitiator and a photoinhibitor. The photoinitiator may be effective to generate a first reactant upon the absorption of at least one photon of a particular wavelength of light. The first reactant may be effective to render the resin soluble or insoluble in a photoresist developer. The photoinhibitor may be effective to generate a second reactant upon the absorption of at least one photon of the particular wavelength of light. The second reactant may be effective to inhibit the first reactant.

In an example, a method for forming a pattern in a photoresist on a substrate is generally described. The method may include applying a layer of photoresist to a substrate. The photoresist may include a resin, a photoinitiator and a photoinhibitor. The photoinitiator may be effective to generate a first reactant upon the absorption of at least one photon of a particular wavelength of light. The first reactant may be effective to render the resin soluble or insoluble in a photoresist developer. The photoinhibitor may be effective to generate a second reactant upon the absorption of at least one photon of the particular wavelength of light. The second reactant may be effective to inhibit the first reactant. The method may include applying to the photoresist light of the particular wavelength through a mask having a pattern to form the pattern in the photoresist.

In an example, a system effective to form a pattern in a photoresist on a substrate is generally described. The system may include a substrate, a layer of photoresist on the substrate, a light source, a mask and a processor. The layer of photoresist may include a resin, a photoinitiator and a photoinhibitor. The photoinitiator may be effective to generate a first reactant upon the absorption of at least one photon of a particular wavelength of light. The first reactant may be effective to render the resin soluble or insoluble in a photoresist developer. The photoinhibitor may be effective to generate a second reactant upon the absorption of at least one photon of the particular wavelength of light. The second reactant may be effective to inhibit the first reactant. The mask may have a pattern. The processor may be arranged in communication with the light source. The processor may be effective to control the light source to apply light through the mask and form the pattern in the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 2 depicts a flow diagram for an example process for implementing optical lithography using a photoresist with a photoinitiator and a photoinhibitor;

FIG. 3 illustrates a computer program product that can be utilized to implement optical lithography using a photoresist with a photoinitiator and a photoinhibitor; and FIG. 4 is a block diagram illustrating an example computing device that is arranged to implement optical lithography using a photoresist with a photoinitiator and a photoinhibitor, all arranged according to at least some embodiments described herein.

DETAILED DESCRIPTION

Figure 1A:
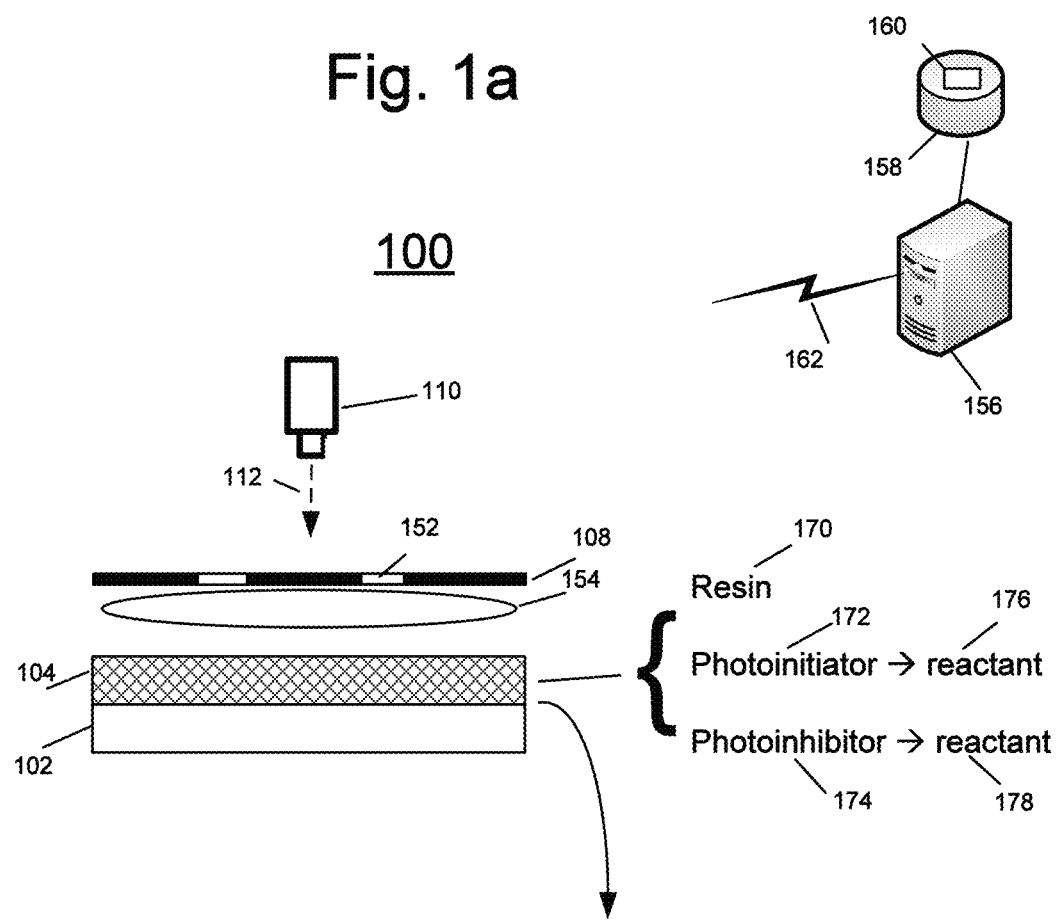
FIG. 1a illustrates an example system that can be utilized to implement optical lithography using a photoresist with a photoinitiator and a photoinhibitor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, materials and apparatus related to implementing optical lithography using a photoresist with a photoinitiator and a photoinhibitor.

Briefly stated, technologies are generally described for a photoresist and methods and systems for forming a pattern in a photoresist on a substrate. In some examples the photoresist includes a resin, a photoinitiator and a photoinhibitor. The photoinitiator may be effective to generate a first reactant upon the absorption of at least one photon of a particular wavelength of light. The first reactant may be effective to render the resin soluble or insoluble in a photoresist developer. The photoinhibitor may be effective to generate a second reactant upon the absorption of at least one photon of the particular wavelength of light. The second reactant may be effective to inhibit the first reactant.

Other than in the working examples or where otherwise indicated, at least some numbers expressing amounts of materials, reaction conditions, time durations, quantified properties of materials, and so forth, stated in the specification and claims are to be understood as being modified by the term "about."

Any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1a illustrates an example system that can be utilized to implement optical lithography using a photoresist with a photoinitiator and a photoinhibitor arranged according to at least some embodiments described herein. An example optical lithography system 100 may include a substrate 102, a photoresist layer 104, a light source 110, an optical system 154, and/or a mask 108. At least some of these elements may be arranged in communication with a processor 156 through a communication link 162. In some examples, processor 156 may be adapted to be in communication with a memory 158 that includes instructions 160 stored therein. Processor 156 may be configured, such as by instructions 160, to control at least some of the operations described below.

In an example, light source 110 may be effective to apply a beam of light 112 of a particular wavelength effective to form a pattern in the photoresist 104. The wavelength can be any wavelength suitable for the purposes described herein. For example, the particular wavelength may include wavelengths in the infrared, visible or ultraviolet portion of the electromagnetic spectrum. In an example, the particular wavelength can be at or above 193 nm. In an example, the particular wavelength can be from about 300 nm to about 400 nm. In an example, the particular wavelength can be up to 800 nm. In an example, substrate 102 may be a silicon wafer. In an example, photoresist 104 may be applied on substrate 102 by spin coating or by some other suitable method.

In some examples, light source 110 may be configured to apply beam of light 112 to mask 108. Based on a pattern 152 on mask 108, at least some photons of beam 112 may pass through mask 108, through optical system 154 and to photoresist layer 104. In some examples, light source 110 may be configured to output light with a power greater than about 3 mW/cm². Mask 108 may be configured to block some photons of beam of light 112 and allow other photons of beam 112 to pass through based on pattern 152. In some examples, optical system 154 may be configured to refract beam 112 to allow for a change in magnification of pattern 152 from mask 108 to photoresist 104.

In an example, photoresist 104 may include a resin 170, a photoinitiator 172, and/or a photoinhibitor 174. Resin 170 may be adapted to undergo polymerization or depolymerization when acted upon by beam 112. Photoinitiator 172 may be effective to generate a first reactant 176 upon absorption of at least one photon of the particular wavelength of light. First reactant 176 may be effective to polymerize or depolymerize, and/or render soluble or insoluble, resin 170 upon the absorption of at least one photon of light at the particular wavelength. In an example, photoinitiator 172 may generate reactant 176 upon the absorption of two or more photons of light at the particular wavelength.

Photoinhibitor 174 may be effective to generate a second reactant 178 upon the absorption of at least one photon of light at the particular wavelength as that to which photoinitiator 172 is responsive. Second reactant 178 may be effective to inhibit first reactant 176 and thereby inhibit the polymerization or depolymerization and/or the rendering soluble or insoluble, of resin 170. In an example, the molar ratio of first reactant 176 to second reactant 178 may range from about 1.5:1 to about 2.5:1.

Among other possible benefits, a system in accordance with that described may be effective to produce lines in photoresist 104 of a desired width. For example, in FIG. 1b, graph 140 illustrates an intensity response, or an amount of generated reactants, by photoinitiator 172 and photoinhibitor 174 based on light of certain wavelengths. Among other things, graph 140 illustrates line widths that may be achieved by the combination of photoinitiator 172 and photoinhibitor 174 in photoresist 104. Curve 142 illustrates an example response, or amount of generated reactants, of a two photon photoinitiator 172 to beam 112. As shown, a minimum line width formed by reactants generated by the two photon photoinitiator by itself may be represented as W1.

Curve 144 illustrates an example response of a single photon photoinhibitor 174 to beam 112. In these examples, using a single photon photoinhibitor in conjunction with a two photon photoinitiator achieves a line width of W2, which may be smaller than W1. This may result in smaller features in the resulting pattern applied to the photoresist 104 and substrate 102. In an example, line widths W2 of 50 nm or less can be achieved with beam 112 at a wavelength of 365 nm. In an example, line widths W2 of 40 nm or less can be achieved with light at a wavelength of 365 nm.

Figure 1B:
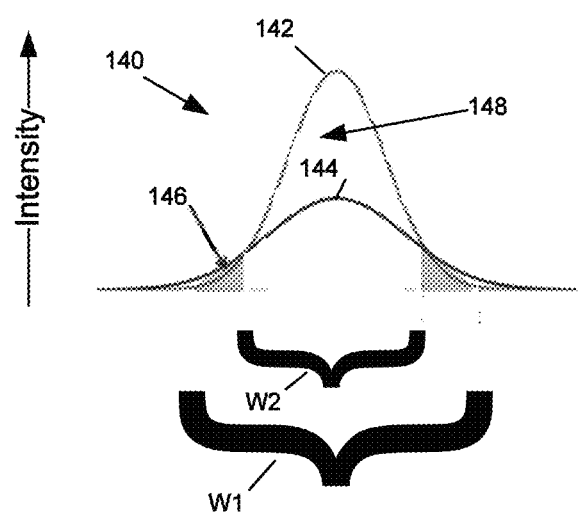
FIG. 1b is a diagram illustrating line widths that may be achieved by the combination of a photoinitiator and a photoinhibitor in a photoresist.

As shown in region 148 of FIG. 1b, focused at a location where a feature of pattern 152 is to be formed, photoinhibitor 174 may produce a lower activation intensity response, or produce less second reactant, than the first reactant produced by two photon photoinitiator 172. In this region, beam 112 generates more of first reactant 176 than second reactant 178. As shown at 146 of FIG. 1b, at a region outside a boundary of a feature of pattern 152, the response of the photoinhibitor is equal to, or exceeds that of the photoinitiator. That is, as shown in FIG. 1b, the activation response of curve 144 of the photoinhibitor intersects and/or crosses over curve 142 of the photoinitiator. In region 146, more of second reactant 178 is generated than first reactant 176. In this example, first reactant 176 may be rendered inactive and the photoresist resin is not polymerized or depolymerized and/or not rendered soluble or insoluble. Accordingly, a resulting feature formed in the photoresist may have a narrower width of W2, rather than the wider width W1.

In an example, two photon photoinitiator 172 may generate an acidic first reactant 176 upon the absorption of two photons. In an example, photoinhibitor 174 may generate a basic second reactant 178 upon the absorption of a single photon as described below. In an example, photoinitiator 172 may include a mixture of a caged benzophenone and diphenyliodonium hexafluorophosphate (($C_6H_5$)$_2$I($PF_6$)), as illustrated below in Chart 1. In this example photoinitiator, the caged benzophenone absorber may generate a radical upon the absorption of two photons at 365 nm wavelength, and the radical may combine with the diphenyliodonium hexafluorophosphate to produce hexafluorophosphoric acid (HPF$_6$). The hexafluorophosphoric acid may be capable of decomposing the resin to make the resin soluble in a photoresist developer. A photoresist developer suitable for the purposes described herein can include, for example, water, alcohol, alkaline solutions of water using ammonium hydroxide as the alkaline component, organic solvents such as PGMEA (Propylene Glycol Methyl Ether Acetate), etc.

CHART 1

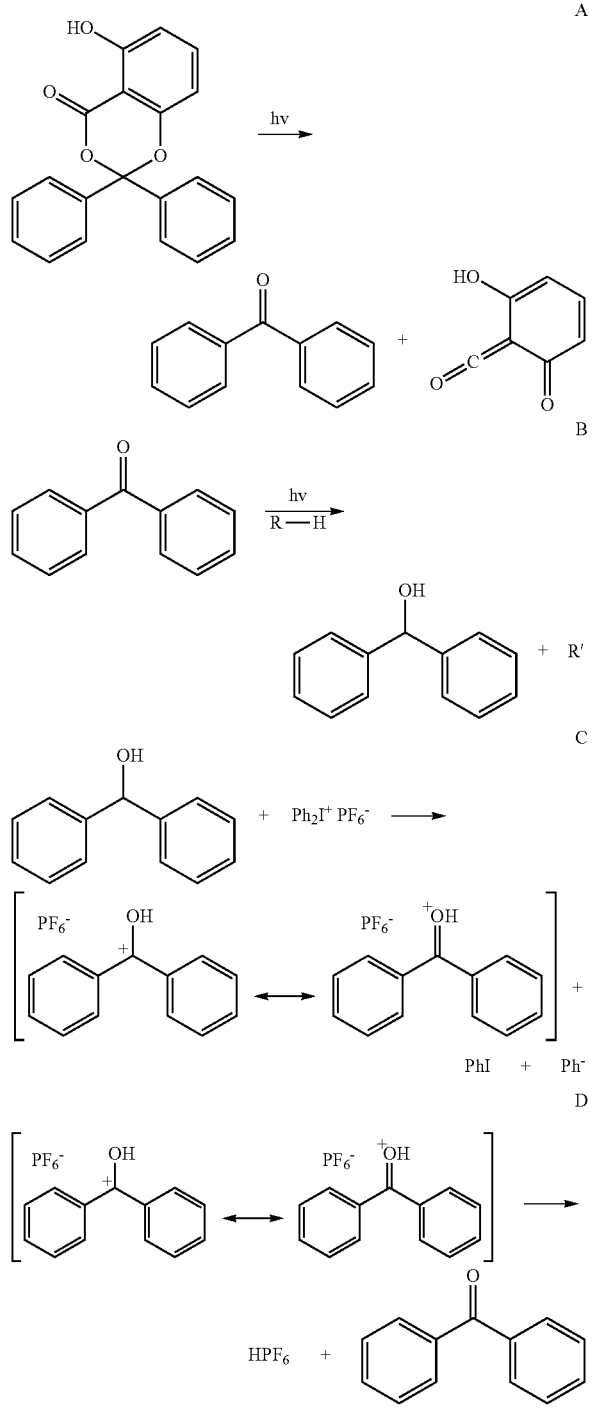

More particularly, referring to Chart 1, at A, caged benzophenone may be exposed to light having photons of 365 nm wavelength. Upon the absorption of a first photon (h<), the cage may be cleaved and a molecule of benzophenone (($C_6H_5)_2C(=O)$) may be released. At B, the benzophenone absorbs a second photon (h<) of the same wavelength and abstracts a hydrogen atom from surrounding molecules R—H to generate a radical (($C_6H_5)_2C(OH)^+$). At C, the radical reacts with the diphenyliodonium hexafluorophosphate ultimately producing hexafluorophosphoric acid (HPF$_6$) and releasing a molecule of benzophenone.

In an example, photoinhibitor 174 may be Bis(ben-zophenone oxime)-N,N'-hexamethylenediurethane. In an example, photoinhibitor 174 may be a benzyl oxime ester as illustrated below in Chart 2:

CHART 2

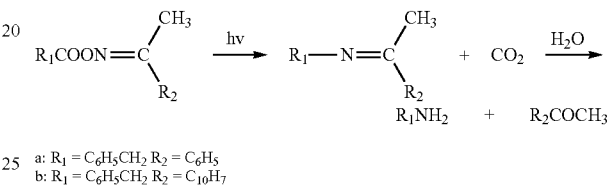

a: $R_1 = C_6H_5CH_2$ $R_2 = C_6H_5$
b: $R_1 = C_6H_5CH_2$ $R_2 = C_{10}H_7$

Referring to Chart 2, an example benzyl oxime ester may have the formula $R_1C(O)ON=(CH_3)R_2$ where, in an example, $R_1$ can be $C_6H_5CH_2$ and $R_2$ can be, for example, $C_6H_5$ or $C_{10}H_7$. Upon the absorption of a single photon (h<), the photoinhibitor may produce a basic amine compound $R_1NH_2$ as the second reactant. The basic second reactant 178 may inhibit the acidic first reactant 176.

Beam of light 112 may activate resin 170 when the acid reactant 176 generated by photoinitiator 172 is greater than base reactant 178 generated by photoinhibitor 174. In these examples, photoinitiator 172 and photoinhibitor 174, in combination, allow for a narrowing of the line width of a pattern formed in the photoresist.

FIG. 2 depicts a flow diagram for an example process for implementing optical lithography using a photoresist with a photoinitiator and a photoinhibitor in accordance with at least some embodiments described herein. The process in FIG. 2 could be implemented using, for example, system 100 discussed above. An example process may include one or more operations, actions, or functions as illustrated by one or more of blocks S2, S4 and/or S6. Although illustrated as discrete blocks, various blocks may be divided into additional blocks, combined into fewer blocks, or eliminated, depending on the desired implementation. Processing may begin at block S2.

At block S2, a photoresist may be formed. The photoresist may include a resin, a photoinitiator and a photoinhibitor. In some examples, the photoinitiator and the photoinhibitor may be selected so that both are reactive at a particular wavelength of light. Processing may continue from block S2 to block S4.

At block S4, a system may be configured to apply a layer of the photoresist to a substrate. Processing may continue from block S4 to block S6.

At block S6, a system may be configured to apply light of the particular wavelength to the photoresist. In an example, the light may be transmitted through a mask having a pattern to thereby form the pattern in the photoresist layer. In response to the applied light, the photoinitiator may be effective to generate a first reactant effective to render the resin soluble or insoluble and the photoinhibitor may be effective to generate a second reactant effective to inhibit the first reactant.

FIG. 3 illustrates a computer program product that can be utilized to implement optical lithography using a photoresist with a photoinitiator and a photoinhibitor in accordance with at least some embodiments described herein. Computer program product 300 may include a signal bearing medium 302. Signal bearing medium 302 may include one or more instructions 304 that, when executed by, for example, a processor, may provide the functionality described above with respect to FIGS. 1 and 2. Thus, for example, referring to system 100, may undertake one or more of the blocks shown in FIG. 3 in response to instructions 304 conveyed to the system 100 by signal bearing medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, computer program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

FIG. 4 is a block diagram illustrating an example computing device that is arranged to implement optical lithography using a photoresist with a photoinitiator and a photoinhibitor according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (µP), a microcontroller (µC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include a lithography using photoresist including a photoinitiator and photoinhibitor algorithm 426 that is arranged to perform the functions as described herein including those described with respect to system 100 of FIG. 1. Program data 424 may include lithography using photoresist including a photoinitiator and photoinhibitor data 428 that may be useful for patterning a photoresist as is described herein. In some embodiments, application 422 may be arranged to operate with program data 424 on operating system 420 such that patterning may be provided. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., " a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for forming a pattern in a photoresist on a substrate, the method comprising:
applying a layer of photoresist to a substrate, wherein said photoresist comprises
at least one resin,
at least one material which generates a photoinitiator in response to the absorption of a first photon and thereafter the photoinitiator generates a first reactant in response to the absorption of a second photon of a particular wavelength of light from an exposure to incident light, wherein the first reactant effects a change in a solubility of the resin to render the resin soluble or insoluble in a photoresist developer, and at least one photoinhibitor which generates a second reactant which inhibits the first reactant in response to the absorption of at least one photon of the particular wavelength of light from the exposure to incident light; and applying to the photoresist light of the particular wavelength through a mask having a first pattern to expose the photoresist to a first intensity and a second intensity of the incident light, to form a second pattern in the photoresist, wherein the second pattern is an image of the first pattern; wherein:

the second intensity is greater than the first intensity;

when an area of the photoresist absorbs the first intensity of the light of the particular wavelength from the exposure, more of the photoinhibitor is generated than the photoinitiator; and when the area of the photoresist absorbs the second intensity of the light of the particular wavelength from the exposure, more of the photoinitiator is generated than the photoinhibitor.

2. The method of claim 1, wherein the second pattern formed in the photoresist includes lines having a width of not more than 40 nm.

3. The method of claim 1, wherein the particular wavelength of light is about 300 nm to 400 nm.

4. The method of claim 1, wherein the photoinitiator includes caged benzophenone and diphenyliodonium hexafluorophosphate, and the first reactant generated is hexafluorophosphoric acid; and wherein the photoinhibitor includes a benzyl oxime ester having the formula:

$$R_1COON\!\!=\!\!C(CH_3)(R_2)$$

wherein $R_1$ is $C_6H_5CH_2$, and $R_2$ is $C_6H_5$ or $C_{10}H_7$, and the second reactant generated has the formula $C_6H_5CH_2NH_2$.

5. The method of claim 1, further comprising washing the photoresist with a photoresist developer to develop the second pattern formed in the photoresist.

6. A method for forming a pattern in a photoresist on a substrate, the method comprising:

applying a layer of photoresist to a substrate, wherein said photoresist comprises
  at least one resin,
  at least one material which generates a photoinitiator in response to the absorption of a first photon and thereafter the photoinitiator generates an acidic compound in response to the absorption of a second photon of a particular wavelength of light from an exposure to incidental light, wherein the acidic compound effects a change in a solubility of the resin to render the resin soluble in a photoresist developer, and
  at least one photoinhibitor which generates a basic compound which inhibits the acidic compound in response to the absorption of at least one photon of the particular wavelength of light from the exposure to incident light; and applying to the photoresist light of the particular wavelength through a mask having a first pattern to expose the photoresist to a first intensity and a second intensity of the incident light, to form a second pattern in the photoresist wherein the second pattern formed in the photoresist includes lines having a width of not more than 40 nm; wherein:

the second intensity is greater than the first intensity;

when an area of the photoresist absorbs the first intensity of the light of the particular wavelength from the exposure, more of the photoinhibitor is generated than the photoinitiator; and when the area of the photoresist absorbs the second intensity of light of the particular wavelength from the exposure, more of the photoinitiator is generated than the photoinhibitor.

7. The method of claim 6, further comprising washing the photoresist with a photoresist developer to develop the second pattern formed in the photoresist.

* * * * *

UNITED STATES PATENT AND TRADEMARK OFFICE
CERTIFICATE OF CORRECTION

| | | |
|---|---|---|
| PATENT NO. | : 9,599,895 B2 | Page 1 of 1 |
| APPLICATION NO. | : 14/048682 | |
| DATED | : March 21, 2017 | |
| INVENTOR(S) | : Miller | |

It is certified that error appears in the above-identified patent and that said Letters Patent is hereby corrected as shown below:

In the Specification

In Column 1, Lines 5-6, delete "CROSS REFERENCE TO RELATED APPLICATION" and insert -- CROSS-REFERENCE TO RELATED APPLICATION --, therefor.

In Column 1, Line 8, delete "§121" and insert -- § 121 --, therefor.

In Column 1, Line 9, delete "filed Apr. 12," and insert -- filed on Apr. 12, --, therefor.

In Column 2, Line 28, delete "FIG. lb" and insert -- FIG. 1b --, therefor.

Signed and Sealed this
Third Day of October, 2017

Joseph Matal
*Performing the Functions and Duties of the
Under Secretary of Commerce for Intellectual Property and
Director of the United States Patent and Trademark Office*